United States Patent
Tomitori et al.

(10) Patent No.: US 7,672,048 B2
(45) Date of Patent: Mar. 2, 2010

(54) POSITIONING MECHANISM AND MICROSCOPE USING THE SAME

(75) Inventors: Masahiko Tomitori, Nomi (JP); Toyoko Arai, Nomi (JP); Yutaka Nakae, Nomi (JP)

(73) Assignee: Japan Advanced Instituter of Science and Technology, Nomi-Shi, Ishikawa (JP)

( * ) Notice: Subject to any disclaimer, the term of this patent is extended or adjusted under 35 U.S.C. 154(b) by 288 days.

(21) Appl. No.: 11/791,618

(22) PCT Filed: Nov. 24, 2005

(86) PCT No.: PCT/JP2005/021582

§ 371 (c)(1),
(2), (4) Date: Jul. 10, 2007

(87) PCT Pub. No.: WO2006/057300

PCT Pub. Date: Jun. 1, 2006

(65) Prior Publication Data

US 2008/0212174 A1  Sep. 4, 2008

(30) Foreign Application Priority Data

Nov. 27, 2004  (JP)  ............................... 2004-374829

(51) Int. Cl.
*G02B 21/26* (2006.01)

(52) U.S. Cl. ...................................... 359/393; 359/391

(58) Field of Classification Search .......... 359/391–393
See application file for complete search history.

(56) References Cited

U.S. PATENT DOCUMENTS

| 4,771,178 | A  * | 9/1988  | Egle et al. | ............... 250/442.11 |
| 6,088,155 | A  * | 7/2000  | Tandler et al. | ............... 359/381 |
| 6,488,675 | B1 * | 12/2002 | Radford et al. | ............. 604/540 |

FOREIGN PATENT DOCUMENTS

| JP | H02-269583 | 11/1990 |
| JP | H08-318482 | 12/1996 |
| JP | 2004-515769 | 5/2004 |

* cited by examiner

*Primary Examiner*—Ricky L Mack
*Assistant Examiner*—Vipin M Patel
(74) *Attorney, Agent, or Firm*—Manabu Kanesaka (57) ABSTRACT

A positioning mechanism capable of decreasing width and size and a microscope using the positioning mechanism are provided.

The positioning mechanism is provided with a supporting shaft possessing a spherical surface part at a prescribed position and guides disposed substantially parallel to the supporting shaft and is characterized, on the assumption that of the three-dimensional directions, the axial direction of the supporting shaft constitutes the z direction, by the fact that the supporting shaft is nipped by the guides at the position of the spherical surface part and enabled to oscillate on the spherical surface part as a fulcrum in the xy directions and as well slide in the z direction.

18 Claims, 4 Drawing Sheets

POSITIONING MECHANISM AND MICROSCOPE USING THE SAME

FIELD OF THE INVENTION

This invention relates to a positioning mechanism for a microscope to control the position of a sample stage and a microscope furnished with the positioning mechanism.

DESCRIPTION OF THE RELATED ART

The scanning probe microscopes (hereinafter referred to as "SPM") such as a scanning tunneling microscope and an atomic force microscope are expected to apply not only the surface observation with atomic/molecular resolution but also the manipulation and assembly of individual atoms and molecules. Therefore they are indispensable devices for the nanotechnology. The ultra-high resolution in-lens scanning electron microscope (hereinafter referred to as "SEM") constricts the electron beam to the limit on a sample and exhibits a resolution reaching 0.4 nm. The transmission electron microscope (hereinafter referred to as "TEM") is an electron microscope that applies electrons with a high energy exceeding several hundred electron volts to a sample and allows observation of even the crystal lattice of the sample depending on the intensity of the transmition electrons.

The SPM is provided in a mechanism for controlling the relative positions of a probe and a sample using a coarse motion mechanism with a range of millimeters which can bring a probe close to a sample on a nano scale, and a fine motion mechanism capable of controlling a motion by a distance from sub-picometers onward with a micrometer scale. The accuracy of the SPM is limited by the degrees of accuracy of these coarse-fine positioning mechanisms. The Japanese Unexamined Patent Application Publication 2004-515769 discloses an example of the positioning mechanism for use in the SPM. This positioning mechanism causes an object such as a sample holder to be attached to the leading end of a clamp, allows the clamp to retain a spherical surface disposed at the end part of a supporting shaft, and enables the object at the end part to be positioned in three-dimensional directions by moving or rotating the clamp relative to the spherical surface.

DISCLOSURE OF THE INVENTION

Problem to be Solved by the Invention

In recent years, the effort to exalt the performance of the SPM by combining it with the TEM or the SEM has been being tried. The combination is conceivable in two ways, i.e., a method that comprises incorporating the SPM in the TEM or the SEM widely used at present and a method that comprises incorporating the TEM or the SEM in a vacuum chamber specially used for the SPM. For the sake of accomplishing the combination while keeping the high performance of TEM or SEM, the former method proves to be promising. As regards the general-purpose SEM, since it has a large sample stage, the combination thereof with the SPM can be easily accomplished by having the SPM incorporated in the sample stage. As regards the TEM or the ultra-high resolution in-lens SEM, however, since the sample stage holder is in a tubular shape of narrow width, the conventional positioning mechanism is too large to render easy the incorporation of the SPM in the sample holder thereof and particularly this incorporation of the SPM in such a manner as to induce provision of a mechanism capable of realizing positioning in three-dimensional directions.

The positioning mechanism disclosed in the Japanese Unexamined Patent Application Publication 2004-515769 possesses a compact configuration but lacks the stability of construction. To be specific, the positioning mechanism is directed toward permitting attachment of an object to the leading end of a clamp and enabling movement and rotation of the object about the portion retaining a spherical surface as a fulcrum. Thus, the construction incurs difficulty in maintaining balance because the movement in the z direction entails variation of the position of the fulcrum on the clamp. Further, in order to lengthen the moving distance in the z direction or the moving distance in x or y direction without changing the degree of the rotating movement, the clamp is required to add to the length thereof. In this construction, when the clamp of an increased length happens to be extended, the force exerted thereon by the object at the leading end increases and causes the clamp to assume an unstable state. Attachment of a weight to the leading end of the clamp is conceivable for the sake of securing stability in this case. Since the position of the fulcrum is subject to variation as described above, however, even the weight does not ensure maintenance of the balance and the possibility that the weight will contact the spherical surface and impede the movement of the clamp is undeniable. Further, since the clamp requires a plurality of weights to be attached in perfect balance thereto, the adjustment involved turns out to be complicated.

Further, the mechanism that is used for this kind of microscope promises various applications ascribable to the principle thereof besides the intrinsic application to the microscope. Particularly, the positioning mechanism is being directed toward applications to various devices such as a multi-prober used for measuring solid state properties of a semiconductor device, a recording device for writing data with high resolution into a recording medium, a reproducing device for reading with high resolution the data written in the recording medium, a measuring device used as for analyzing atoms and molecules, and a fine working device. In these various devices, the positioning mechanisms are tending toward narrowing pitches, increasing number of motion directions, and pluralizing positioning mechanisms. In order to make the demand a reality, decreasing these positioning mechanisms in width and size is widely expected to be available.

This invention, therefore, is aimed at providing a positioning mechanism that enables reduction in width and size and as well excels in stability and a microscope using this positioning mechanism.

Means to Solve the Problem

With a view to establishing the object mentioned above, the positioning mechanism of this invention is provided with a supporting shaft furnished at a prescribed position with a spherical surface part and guides disposed substantially parallel to the supporting shaft and is characterized, on the assumption that of the three-dimensional directions, the axial direction of the supporting shaft constitutes the z direction, by enabling the supporting shaft to be nipped by the guides at the position of the spherical surface part, to be displaced in the xy direction with the spherical surface part as a fulcrum, and to be slid in the z direction as well.

According to this invention, since the spherical surface part of the supporting shaft is nipped by the guides, the supporting shaft is enabled by rotating about the spherical surface part as a fulcrum to effect a positioning in the xy direction, by sliding in the axial direction along the guides to effect a positioning in the z direction, and by combining the rotating and sliding motions to effect a positioning in the three-dimensional directions. The decrease of width and size aimed at is rendered possible because the positioning in the three-dimensional directions is realized by a simple construction that has the spherical surface part of the supporting shaft nipped by the guides.

Further since the supporting shaft possesses a movable construction and retains the fulcrum thereof constantly at the prescribed position thereof, it is enabled to retain due balance and produce a stable movement constantly even when it happens to slide in the z direction. Further, in order to lengthen the moving distance in the z direction or the moving distance in x or y direction without changing the degree of the rotating movement, the clamp is required to add to the length thereof. Even in spite of this addition, the stability can be easily attained by adjusting the position of spherical surface part as the fulcrum on the shaft or attaching only one weight at an appropriate position on the supporting shaft; that can preclude complicated adjustment.

Further, the guides mentioned above prefer to be in the shape of a rail and the spherical surface part of the supporting shaft prefers to be nipped by at least three rail-like guides. According to this invention, since the spherical surface part of the supporting shaft contacts the guides at three positions, the spherical surface part can be infallibly nipped, prevented from generating any appreciable friction, and enabled to have the rotating and sliding motions proceed stably and smoothly.

The guide mentioned above may be in a tubular shape and the spherical surface part of the supporting shaft may be nipped by the inside perimeter of the tubular guide. According to this invention, a line contact between the supporting shaft and the inside perimeter of the tubular guide enables the supporting shaft to move smoothly and stably.

Further, the positioning mechanism of this invention prefers to be provided with an impact force application means adapted to exert impact force on the supporting shaft. According to this invention, when the impact force application means exerts impact force on the supporting shaft, the supporting shaft is enabled to oscillate and slide and produce a positioning in three-dimensional directions. The impact force application means prefers to be a piezoelectric element. The exertion of this impact force may be implemented by the use of a magnet, by the beating with a hammer, or the like.

Further, the positioning mechanism of this invention prefers to be provided with a deforming means capable of deforming at least part of the supporting shaft mentioned above. According to this invention, it is possible to finely adjust the positioning by deforming, such as by extending and contracting, or flexing, a part of the supporting shaft with the deforming means.

The microscope of this invention is characterized by being furnished with a positioning mechanism set forth in any of claims 1 to 6 that are entered in the Scope of Claim for Patent. The expression "the microscope of this invention" as used herein refers to a microscope combined with a plurality of microscopes or to a simple microscope not yet joined in the combination. According to this invention, since the positioning mechanism of this invention that is capable of allowing decrease in width and size is used, the positioning mechanism can be incorporated in a thin region or a narrow region. Also when the transmission electron microscope (TEM) or the in-lens type scanning electron microscope (SEM) is combined with the scanning probe microscope (SPM), for example, it is rendered possible to have the SPM incorporated in a thin sample holder of the TEM or the in-lens type SEM because the use of the positioning mechanism of this invention for the SPM enables the whole SPM to be thinned.

EFFECT OF THE INVENTION

According to this invention, since the positioning in the three-dimensional directions is realized and the decrease in width and size is enabled by the simple construction of the positioning mechanism that resides in having the supporting shaft nipped by the guides, the positioning mechanism can be incorporated in a thin or narrow space. This incorporation can be implemented in various instruments such as microscopes, a multi-prober, recording and reading devices. Since the positioning mechanism is capable of decreasing width and size, it is rendered possible to allow the incorporation in a complicated construction and satisfy the need to furnish the construction with a narrowed pitch, the increasing number of motion directions, and a plurality of units.

The positioning mechanism retains due balance constantly and realizes a stable motion even when it happens to slide in the z direction because the construction thereof renders the supporting shaft movable and fixes the fulcrum constantly at the prescribed position of the supporting shaft. In order to lengthen the moving distance in the z direction or the moving distance in x or y direction without changing the degree of the rotating movement, the addition to the length of the supporting shaft suffices. Even in the case of making this addition, the stability can be easily secured by adjusting the position of spherical surface part as the fulcrum on the shaft or attaching only one weight at an appropriate position on the supporting shaft. Under any condition, therefore, the stable positioning in the three-dimensional directions is rendered feasible. The attachment of only one weight on the supporting shaft can precluded complicated adjustments using a plurality of weights.

Particularly, the positioning mechanism of this invention promises application to a microscope. The positioning mechanism of this invention, when used in a microscope, realizes allowing the microscope a further reduction of width and size because it is capable of reducing the width and size of its own. The positioning mechanism of this invention is effective in combining the SPM and the TEM or the SPM and the in-lens type SEM. Particularly, while the TEM uses a sample holder of narrow width and the in-lens type SEM requires to have a sample inserted in and mounted on a lens of narrow width, the positioning mechanism of this invention is capable of being reduced in width. When the SPM of narrow width is provided with this positioning mechanism and is incorporated as such in the sample holder of the TEM or the in-lens type SEM, therefore, it is rendered possible to attain their combination. Since the TEM or the in-lens type SEM existing now suffices and needs no alteration of design in any way, the combination can be attained inexpensively and simply. Further, since the TEM or the SEM is also enabled to utilize the positioning mechanism of the SPM after the combination, the reduction of cost can be planned by so altering the design as to allow omission of the conventional complicated positioning mechanism. It is also made possible to observe the same region of a sample with two microscopes differing in kind. Further, it is made possible to have atoms and molecules manipulated and assembled with the SPM while the observation of the sample is implemented with the SEM or the TEM.

EXPLANATION OF REFERENCE NUMERALS 101 102 Positioning mechanism
10 Supporting shaft
11 Spherical surface part
12a First insulation part
12b Second insulation part
13a First piezoelectric element
13b Second piezoelectric element
14 Plumbing part
20, 21 Guide
30 Holder
31a, 31b Opening
32 Threaded hole
33 Probe
34 Fixed part
40 Object (sample stage)
50 Electron gun
60 Sample stage
70 Insertion opening
80 Conventional positioning mechanism
c, c1, c2 Slit
c3 Hole
e1~e6 Electrode

DESCRIPTION OF THE PREFERRED EMBODIMENTS

First Mode of Embodiment

Figure 1:
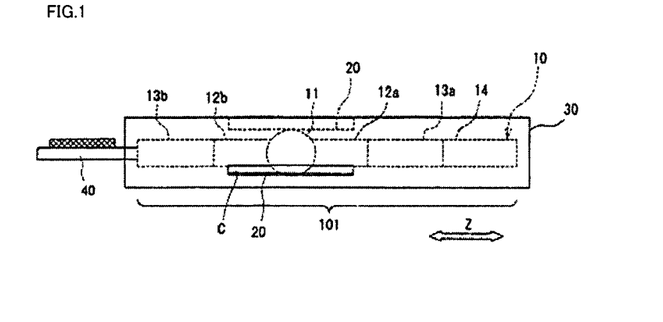
FIG. 1 is a side view of the positioning mechanism in the first mode of embodiment.
Figure 2:
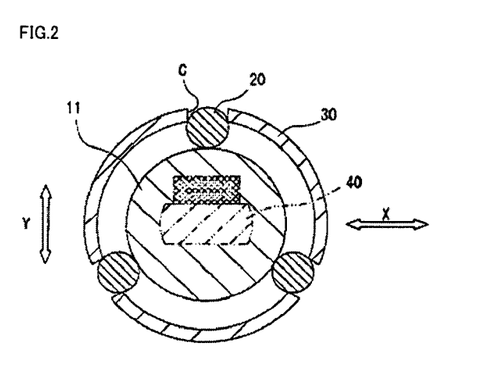
FIG. 2 is a cross section of the positioning mechanism in the mode of embodiment mentioned above.
Figure 3:
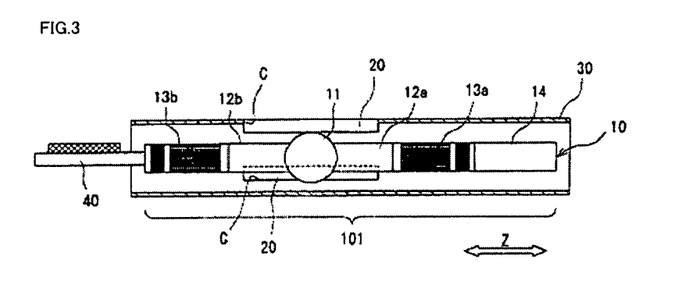
FIG. 3 is an explanatory diagram depicting the internal configuration of the positioning mechanism in the mode of embodiment mentioned above.

Now, a positioning mechanism 101 in the present mode of embodiment will be explained below by reference to the drawings. FIG. 1 is a side view of the positioning mechanism 101 and FIG. 2 is a cross section thereof. FIG. 3 is an explanatory diagram depicting the internal configuration thereof. The positioning mechanism 101 is provided with a supporting shaft 10 and guides 20 disposed substantially parallel to the supporting shaft 10. The supporting shaft 10 is enabled to oscillate in the xy directions and, in order to be enabled to slide in the z direction, is nipped by the guides 20 at the position of a spherical surface part 11 whose outer peripheral surface is formed by part of a spherical surface. Here, it is assumed that in the mutually perpendicular three-dimensional directions of x direction, y direction and z direction, the direction of the central axis p of the supporting shaft 10 constitutes the z direction and the other two directions constitute the x direction and the y direction. In the specific construction, the positioning mechanism is provided, for example, with the supporting shaft 10 and the rail-like guides 20 that are disposed roughly parallel to the supporting shaft 10. This positioning mechanism 101, as integrally constructed with the supporting shaft 10 and the guides 20 that are contained in a holder 30, assumes the shape of a stick of small width (resembling a pencil). An object 40 to be positioned is attached to the leading end of the supporting shaft 10 and the movement of the supporting shaft 10 is manipulated for positioning the object 40. The object to be positioned is a sample stage or a probe when the positioning mechanism is used in a microscope, for example. It may be otherwise an operating arm or a member for use in a sensor. Thus, the object 40 is arbitrarily selected, depending on the kind of device to which the positioning mechanism is applied. The present mode of embodiment will be explained below by citing a sample stage as the object 40.

Figure 4:
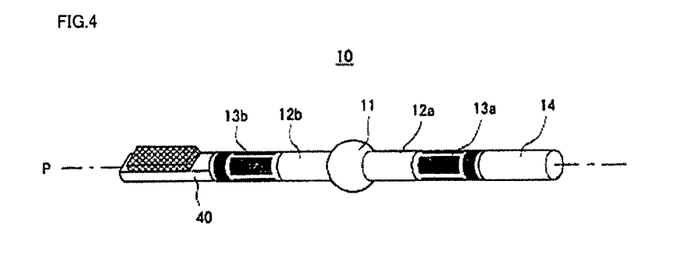
FIG. 4 is an oblique view illustrating the supporting shaft in the mode of embodiment mentioned above.

FIG. 4 is an oblique view illustrating the positioning mechanism 10. The supporting shaft is in a roughly columnar shape and is provided in the neighborhood of the center thereof with the spherical surface part 11. It is further provided on one side from the spherical face part 11 with a first insulating part 12a, a first piezoelectric element 13a, and a plumbing part 14 sequentially as reckoned from the spherical face part 11 side onward and on the other side therefrom with a second insulating part 12b and a second piezoelectric element 13b. The spherical surface part 11 is formed of a sphere and the other component parts 12a, 12b, 13a, 13b, and 14 are formed of separate bodies in columnar shapes roughly equal in diameter. These members are concatenated with the central axis p thereof aligned abreast so as to give rise to one line approximately resembling a stick that is furnished near the center thereof with the spherical surface part 11. The positions of the component members do not need to be limited to those mentioned above but may be properly altered.

The spherical surface part 11 is the part of the supporting shaft 10 that is furnished with a spherical surface and it is formed of the surface of a sphere. This spherical surface part 11 is configured by having the sphere disposed between the first insulating part 12a and the second insulating part 12b and concatenated therewith and it is positioned in the approximate neighborhood of the center of the supporting shaft 10. The sphere that forms the spherical surface part 11 has a diameter larger than the diameter of the remainder columnar-shape part of the supporting shaft 10 and has the spherical surface part 11 assume a state bulging from the remainder part. The spherical surface part 11 has the surface thereof polished in order to decrease the friction thereof. The sphere forming the spherical surface part 11 prefers to be a sphere of sapphire from the viewpoint of inducing no appreciable friction and tolerating frictional wear.

Here, the spherical surface part 11 does not need exclusively to be the whole surface of a sphere but is only required to have at least partly spherical surface. For example, the hemispherical surface that represents the case of being furnished with a surface obtained by cutting off part of the surface of a sphere is defined as being included in the spherical surface part of this invention. Also the case of having part of the region of the spherical surface hidden in consequence of the concatenation of the insulating parts 12a and 12b as in the present mode of embodiment in included in the spherical surface part of this invention because the remainder of the region is formed of part of the surface of a sphere. Even when the spherical surface part 11 is integrally constructed with the insulating parts 12a and 12b instead of using a separate sphere as the spherical surface part 11, for example, it is included in the spherical surface part 11 of the present invention because the spherical surface part 11 is furnished with part of the surface of a sphere.

The insulating parts 12a and 12b are disposed between the first piezoelectric element 13a and the spherical surface part 11 and between the second piezoelectric element 13b and the spherical surface part 11 as well and concatenated therewith. These insulating parts 12a, 12b are made of alumina and consequently enabled to fulfill the role of preventing the electrode parts of the piezoelectric elements 13a and 13b from contacting the guides 20 and the holder 30 and short-circuiting them when the supporting shaft 10 oscillates.

Here, the insulating parts 12a and 12b are severally constructed of a one-piece bar-like member. By having the bar-like members inserted in a hole so disposed as to pass the center of the spherical surface part 11, the insulating parts 12a and 12b may be concatenated as positioned at the opposite sides of the spherical surface part 11. By so doing, it is rendered possible to align easily the central axis p of the spherical surface part 11 and the other members.

The first piezoelectric element 13a is disposed between the first insulating art 12a and the plumbing part 14 and concatenated therewith, and the second piezoelectric element 13b is disposed on the side of the second insulating part 12b opposite the spherical surface part 11 and concatenated therewith. These piezoelectric elements 13a and 13b, as occasion demands, fulfill the function as an impact force application means for exerting impact force on the supporting shaft 10 or as a deforming means for deforming the leading end part of the supporting shaft 10. When the positioning mechanism 101 is used mainly as a coarse adjustment mechanism, it is rendered possible to exert impact on the supporting shaft 10 and making rough positioning by using either of the first piezoelectric device 13a or the second piezoelectric device 13b or both of the first piezoelectric device 13a and the second piezoelectric device 13b as impact force application means. When the positioning mechanism 101 is used mainly as a fine adjustment mechanism, it is rendered possible to deform flexuously or telescopically the leading end part of the supporting shaft 10 and making positioning finely by using the second piezoelectric element 13b as a deforming means. The impact force exerting means is only required to be capable of exerting impact on the supporting shaft 10. It may be what is enabled to exert impact by utilizing the precipitous movement of a magnet due to sudden change of magnetic field or the beating with a hammer. The deforming means is only required to be capable of deforming part of the supporting shaft 10. It may be a magnetic strain element, for example. From the viewpoint of simultaneously realizing the impact force application means and the deforming means, the piezoelectric element proves to be preferable. Further, for the purpose of disposing compactly and three-dimensionally, a cylindrical piezoelectric element (tube piezo element) proves to be preferable. Advantages including lower cost are derived from using elements of the same kind for both the impact force application means for coarse adjustment and the deforming means for fine adjustment. The individual means may be realized by different methods, when necessary.

Figure 5:
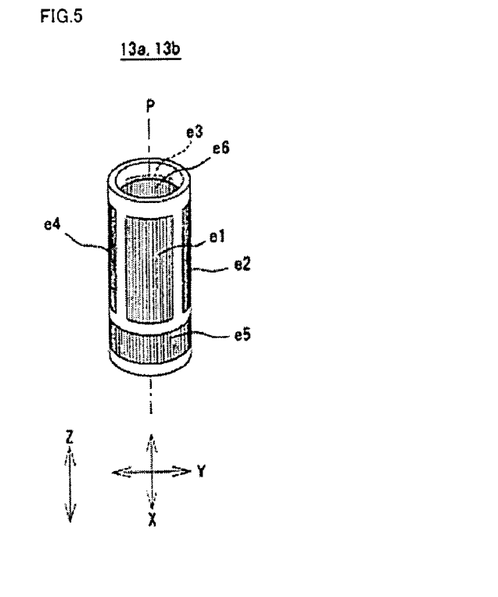
FIG. 5 is an oblique view illustrating the piezoelectric element in the mode of embodiment mentioned above.

FIG. 5 is an oblique view depicting an example of the piezoelectric elements 13a and 13b that function as the impact force application means and the deforming means. For the sake of convenience of explanation, it is assumed that of the three-dimensional directions, the two directions perpendicularly intersecting the central axis p of the supporting shaft 10 are x direction and y direction and the direction of the central axis p of the supporting shaft 10 is z direction. The piezoelectric elements 13a and 13b are joined to a driving power source with an electric wiring not shown in the drawing, and the application of electric voltage generates the mechanical strain of piezoelectric elements. The electric wiring is so laid as to pass the center of the supporting shaft 10 and is consequently prevented from hindering the movement of the supporting shaft 10. The piezoelectric elements 13a and 13b are provided with a cylindrically shaped flexible tube body, four rectangular electrodes e1, e2, e3 and e4 disposed as equally spaced in the circumferential direction on the outer surface of the tube body, a band-shaped electrode e5 laid along the circumference of the tube body, and an inner surface electrode e6 laid along the inner surface of the tube. When a plus or minus electrical voltage is applied to the piezoelectric element 13a (13b) between the inner surface electrode e6 and the outer surface electrodes e1, e2, e3, e4 and e5, the electrodes e1, e2, e3, e4, and e5 are extended or contracted in the axial direction. The choice between the extension and the contraction by the plus electrical voltage applied to the inner surface electrode e6 is not prescribed here because it depends on the direction of polarization of the relevant piezoelectric element. When an electrical voltage is applied to the rectangular electrodes e1 and e3 or electrodes e2 and e4 that are disposed opposite each other in such a manner that one of the electrodes will be extended and the other contracted, the piezoelectric element 13a (13b) is bent in the x direction and the y direction. The electrical voltage does not need to be applied to the two electrodes without fail but may be applied to at least one of these electrodes e1 to e4. When the electrical voltage is applied instead to the band-shaped electrode e5, the electrode e5 is extended and contracted in the direction of the central axis p and the piezoelectric elements 13a (13b) is consequently extended and contracted in the z direction. When zero voltage is applied, the piezoelectric elements 13a (13b) is released from the flexed, extended or contracted state and then restored to its original state.

With a view to allowing the piezoelectric elements 13a and 13b to function as the impact force application means, when the applied voltage is instantly changed to zero, the flexed, extended or contracted state is suddenly restored to its original state, and when the reversed voltage is applied, the flexed, extended or contracted state is induced in the reverse direction. This sudden deformation results in exerting impact force in the x direction or the y direction, enabling this impact force to oscillate the supporting shaft 10 with the spherical surface part 11 as a fulcrum, and allowing the positioning in the x direction or the y direction. When zero or reversed voltage is applied to the electrode e5, the electrode e5 is released from the extended/contracted state, resulting in its original state, or induced to extend or contract in the reverse direction. The restoration or the extended/contracted state in the reverse direction leads to apply the impact force to the z direction. This impact causes the supporting shaft 10 to slide along the guides 20 and allow the positioning in the z direction.

As the deforming means, only the second piezoelectric element 13b that is positioned more toward the object 40 than toward the spherical surface part 11 is used. In the case of causing the second piezoelectric element 13b to function as the deforming means, while kept adjusting electric voltage is applied to the second piezoelectric element 13b until the element 13b is flexed, extended or contracted. Then when the device is assumed to reach to a proper state, the electric voltage is maintained to keep the flexed, extended or contracted state. The flex enables the second piezoelectric element 13b to make positioning in the x direction and the y direction, and the extension/contraction enables the second piezoelectric element 13b to make positioning in the z direction.

While in the present mode of embodiment, the positioning (bending) in the x direction and the y direction is realized by the rectangular electrodes e1, e2, e3 and e4, and the positioning in the z direction is realized by the band-shaped electrode e5. Simultaneously extending or contracting the rectangular electrodes e1 to e4 enables the piezoelectric elements 13a and 13B to move in the three-dimensional directions by extending or contracting the piezoelectric elements 13a and 13b in the z direction. Since the number of the rectangular electrodes and the positions thereof are issues of arbitrary decision, it is rendered possible to control the movement of the positioning mechanism more finely by adjusting the number and the positions. While the impact force application means and the deforming means form part of the supporting shaft 10 in the present mode of embodiment, they may be separate members from the supporting shaft 10 when necessary.

The plumbing part 14 is in a cylindrical shape and is connected to the end part of the first piezoelectric element 13a. The plumbing part 14 is a weight possessing a nearly equivalent weight to the object 40 that is attached to the leading end of the second piezoelectric element 13b and is directed to allowing the spherical surface part 11 to keep its balance with the spherical surface part 11 as a fulcrum. The weight and the position of the plumbing part 14 may be properly adjusted, depending on the weights of the supporting shaft 10 and the object 40 and the position of the spherical surface part 11 fated to serve as a fulcrum.

The supporting shaft 10 is nipped by the three rail-like (slender columnar shape) guides 20 in the spherical surface part 11. The individual guides 20 are adapted to fulfill the role of guiding the movement of the supporting shaft 10 and are fixed as inserted severally in the three slits c formed on the cylindrical holder 30. Though the guides prefer to be made of metal considering good processability, they do not always need to be made of metal. Each width of the slits c on the holder 30 is formed smaller than the diameter of the guide 20. The guides 20 are inserted into the slits c from the inner peripheral side of the holder 30 and mounted to project toward the inner peripheral side. The guides 20 inserted in the slits c are disposed parallel to the central axis p and equally spaced in the circumferential direction, and the supporting shaft 10 is disposed therein. The guides 20 nip the spherical surface part 11 of the shaft 10, depressing in three directions. The individual guides 20 are in a columnar shape and are held in point contact with the spherical surface part 11. Though the number of the guides 20 prefers to be three from the viewpoint of decreasing friction, it may be four or more. From the viewpoint of decreasing friction, the surfaces of the guides 20 that contact the spherical surface part 11 may be curved surfaces, flat surfaces, or angular surfaces, which invariably come into point contact with the spherical surface part 11. Though the guides prefer to be in a columnar shape for the purpose of enabling the depressing forces exerted in the three directions on the spherical surface part 11 to be manifested in good balance, they may be in the shape of a triangular pole or a square pole or in other shape.

Here, the holder 30 is endowed by the plurality of slits c with the function of a leaf spring. The slits c, therefore, prefer to be formed while the widths and the lengths thereof are so adjusted that the guides 20 may be enabled to nip the supporting shaft 10 and exert depressing force enough for allowing the supporting shaft 10 to oscillate and slide smoothly.

The positions of the component members do not need to be limited in conformity with the mode of embodiment described above but may be arbitrarily selected in the range in which the function contemplated by this invention is fulfilled. The spherical surface part 11, for example, does not need to be always positioned in the neighborhood of the center of the supporting shaft 10 but may be positioned as deviated toward either of the bilateral end parts and balanced with the weight of the plumbing part 14.

In the positioning mechanism 101 of the present mode of embodiment, the supporting shaft has a length of 91 mm and the spherical surface part has a diameter of 4.76 mm. The holder 30 approximately measures 100 mm in length, 8 mm in outside diameter, and 7 mm in inside diameter. The slits c formed in the holder 30 have a width of 1.5 mm and the guides 20 have a diameter of about 1.6 mm. Owing to the fact that the holder 30 furnished in itself with elasticity by the guides 20 fulfils the role of a leaf spring, the guides 20 hold down the spherical surface part 11 of the supporting shaft 10 with proper pressure. The sizes mentioned above do not need to be exclusive but may be properly altered to suit design.

(Explanation of Operation)

Figure 6:
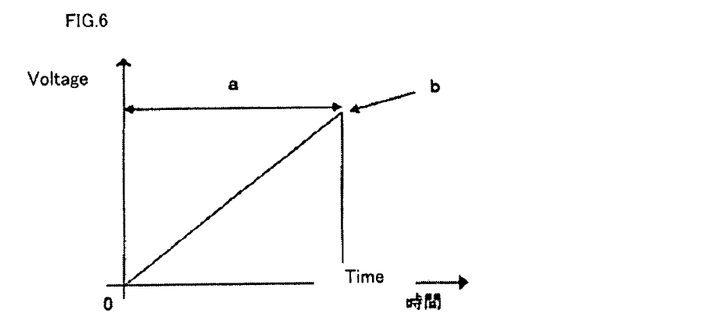
FIG. 6 is a drawing graphically illustrating the relation between the electrical voltage applied to the piezoelectric element and the time.

Now, the operation of the positioning mechanism 101 described above will be explained below. For the purpose of using the positioning mechanism 101 as a coarse adjustment mechanism, electrical voltage is applied to the first piezoelectric element 13a and/or the second piezoelectric element 13b. The electrical voltage prefers to be a serration voltage that increases with time and suddenly stops as illustrated in FIG. 6. For example, the application of electrical voltage is suddenly stopped at the point of time at which the electrical voltage reaches the magnitude b after the elapse of time of the length a. For the purpose of positioning the object 40 in the x direction or the y direction, impact force is imparted in the x direction or the y direction by extending and contracting at least one of the rectangular electrodes e1 to e4 of the first piezoelectric element 13a and/or the second piezoelectric element 13b with electrical voltage and then restoring to its original state with a sudden stop of the electrical voltage; or by extending and contracting in the opposite direction with electrical voltage in the opposite direction. By this impact force, the supporting shaft 10 is rotated with the spherical surface part 11 as a fulcrum and enabled the object 40 to make positioning in the x direction or the y direction. For the purpose of positioning the object 40 in the Z direction, the impact force is imparted in the z direction by extending and contracting the band-shaped electrode e5 by application of electrical voltage and reverting it to the basic posture by sudden stop of the electrical voltage. By this impact force, the supporting shaft 10 is slid in the z direction and enabled to make positioning in the z direction of the object 40. That is, the positioning mechanism 101, in spite of possessing small width, enables the positioning in three-dimensional directions. Though only one of the two piezoelectric elements of 13a and 13b may be subjected to application of electrical voltage, the rotation and other movements of the supporting shaft 10 may be controlled by applying the electrical voltage as adjusted to both the piezoelectric elements 13a and 13b. It is also permissible to control the amount of oscillation and the amount of slide by applying the electrical voltage as adjusted.

For the purpose of using the positioning mechanism 101 as a fine adjustment mechanism, the second piezoelectric element 13b nearby the object 40 side is subjected to application of electrical voltage. For the purpose of positioning the object 40 in the x direction or the y direction, the second piezoelectric element 13b is bent by applying electrical voltage to at least one of the rectangular electrodes e1 to e4 and enabled to retain the bent state by maintaining the electrical voltage in a proper state. The piezoelectric element 13b that constitutes the leading end part of the supporting shaft 10 is consequently bent and enabled to effect due positioning in the x direction or the y direction of the object 40. For the purpose of positioning in the z direction, the second piezoelectric element 13b is extended and contracted by applying electric voltage to the band-shaped electrode e5 and enabled to retain the extended and contracted state by maintaining the electrical voltage in a proper state. The second piezoelectric element 13b that constitutes the leading end part of the supporting shaft 10 is consequently extended and contracted and enabled to make positioning in the z direction of the object 40. When the positioning mechanism 101 is used as the fine adjustment mechanism as described above, the exertion of impact force will not occur and the whole supporting shaft 10 will not oscillate nor slip because the flexed, extended or contracted state is retained by the maintenance of electrical voltage. The fine positioning in the three-dimensional directions, therefore, is enabled owing solely to the deformation of the second piezoelectric element 13b.

Further, the positioning mechanism 101 always keeps its own balance in spite of a slide in the z direction and realizes a stable movement because the construction thereof renders the supporting shaft 10 movable and the fulcrum is fixed at the prescribed position of the supporting shaft 10. In order to lengthen the moving distance in the z direction or the moving distance in x or y direction without changing the degree of the rotating movement, it becomes necessary to add to the length of the supporting shaft 10. Even in this case, the stability can be easily secured by the position of the fulcrum and the addition of the plumbing part 14. Since the addition of just one plumbing part 14 at an appropriate position of the supporting shaft 10 suffices for the stability, the complication possibly entailed otherwise for adjusting a plurality of plumbing parts can be avoided.

Second Mode of Embodiment

Figure 7:
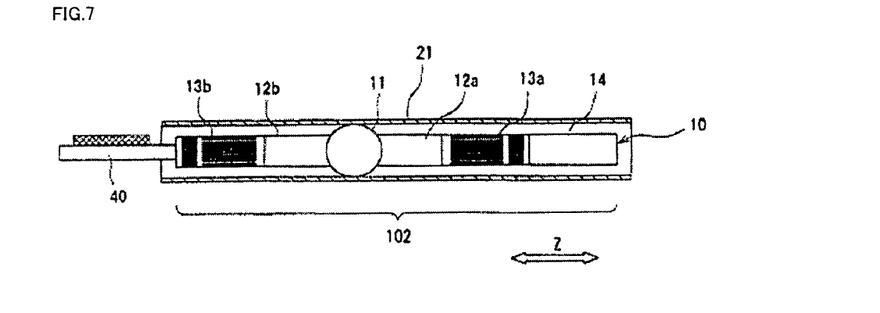
FIG. 7 is an explanatory diagram depicting the positioning mechanism in the second mode of embodiment.

In the present mode of embodiment, the case wherein a guide 21 has a cylindrical shape will be explained. FIG. 7 is a cross section illustrating a positioning mechanism 102 of the present mode of embodiment. While the supporting shaft 10 is similar to the countertype in the first mode of embodiment described above, the guide 21 assumes a cylindrical shape and concurrently serves as the holder 30. The inner periphery of the guide 21 enables the spherical surface, part 11 of the supporting shaft 10 to be gripped infallibly and as well possesses a size for nipping the supporting shaft 10 with proper pressing force in order that the supporting shaft 10 may generate such low degree of friction as allows the supporting shaft 10 to oscillate and slide on the guide 21. Since the supporting shaft 10 is nipped by the guide 21 in the spherical surface part 11, the supporting shaft 10 is enabled to oscillate and slide and, in spite of small width, effect due positioning in the three-dimensional directions. The spherical surface part 11 and the guide 21 are constantly retained in line contact and enabled to oscillate and slide stably and smoothly. Since the guide 21 is constructed of a sole pipelike member and is adapted to fulfill concurrently the role of a holder, the positioning mechanism 102 is satisfied with a small number of component parts and is enabled to simplify the process of assemblage and lower the cost of production as compared with the embodiment using a plurality of guides.

(Mode of Embodiment of SPM)

Figure 8:
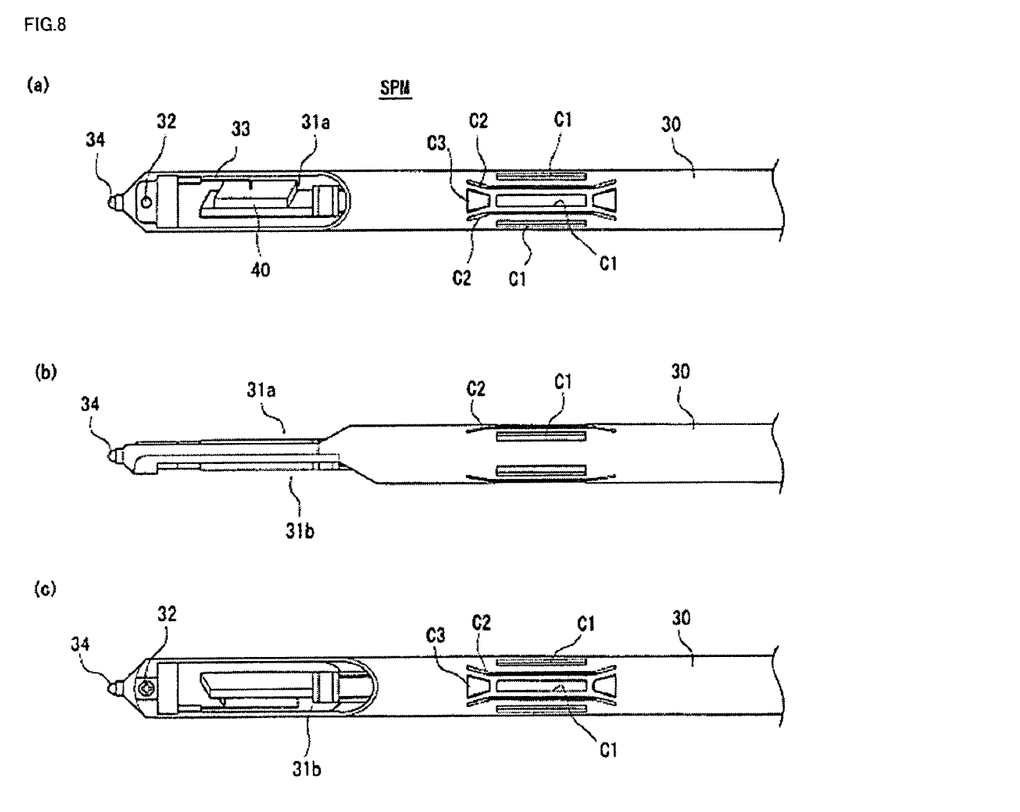
FIG. 8 is a drawing illustrating the SPM using the positioning mechanism in the first mode of embodiment mentioned above.

While the positioning mechanisms 101 and 102 of the modes of embodiment described above can be used for various applied devices, they may be used for microscopes as described below, for example. FIG. 8 is a drawing illustrating a SPM using the positioning mechanism 101 of the first mode of embodiment described above; (a) depicting the top view thereof, (b) the side view thereof, and (c) the bottom view thereof. In the SPM of the present mode of embodiment, the same positioning mechanism 101 as involved in the first mode of embodiment described above is contained in a tubular holder 30. The holder 30 is provided with six slits c1 that are disposed parallel to the central axis p and spaced at equal intervals in the circumferential direction, four slits c2 that have bends formed at the opposite end parts thereof and are disposed between the slits c1, and trapezoidal holes c3 disposed in the regions enclosed with the end parts of the slits c2 neighboring the slits c1. The three guides 20 are severally embedded across every two of the six slits c1. The slits c1, c2 and the holes c3 impart the function of a leaf spring to the holder 30 and enable the holder 30 to manifest proper depressing force toward the inner side, with the result that the guides 20 will be adjusted to nip the supporting shaft 10 with proper force. The holder 30 is provided in the leading end side thereof with openings 31a, 31b that each fall on either side of the line passing the diameter as the boundary so that the sample stage 40 mounted on the leading end of the supporting shaft 10 contained in the holder 30 may be exposed via the openings 31a, 31b. The holder 30 is provided in the leading end thereof with a threaded hole 32. A probe 33 is attached in the threaded hole 32 in a direction opposite the sample stage 40. The holder 30 is provided in the leading end thereof with a fixing part (sapphire semisphere) 34 adapted to fix the holder 30 when the positioning mechanism 101 is incorporated in the SEM that will be specifically described below.

For the purpose of using this SPM, it is necessary that a sample be set on the sample stage 40 and the sample on the sample stage 40 and the probe 33 be positioned. During the course of this positioning, first the positioning mechanism 101 is used as a coarse adjustment mechanism. The use as the coarse adjustment mechanism is implemented by applying electrical voltage to either or both of the piezoelectric elements 13a and 13b, then exerting impact force on the supporting shaft 10 by suddenly changing the electrical voltage to zero or applying electrical voltage in the reverse direction, and oscillating and sliding the supporting shaft 10 thereby effecting due positioning in three-dimensional directions. For the purpose of further effecting positioning by fine adjustment subsequent to the positioning by coarse adjustment, the positioning mechanism 101 is used as a fine adjustment mechanism. The use as the fine adjustment mechanism is implemented by applying electrical voltage to the second piezoelectric to the second piezoelectric element 13b thereby deforming the second piezoelectric element 13b via bending and extension and contraction and effecting fine positioning in three-dimensional directions. By using the positioning mechanism 101 of this invention, it is rendered possible to effect incorporation of this positioning mechanism 101 in the holder 30 of small width and impartation of a decreased width to the SPM. When the holder 30 happens to be a sample holder of SEM or TEM, for example, this sample holder has small width. By using the positioning mechanism 101 of this invention, it is made possible to accomplish incorporation of the SPM in the sample holder of such small width.

(Mode of Embodiment of SEM)

Figure 9:
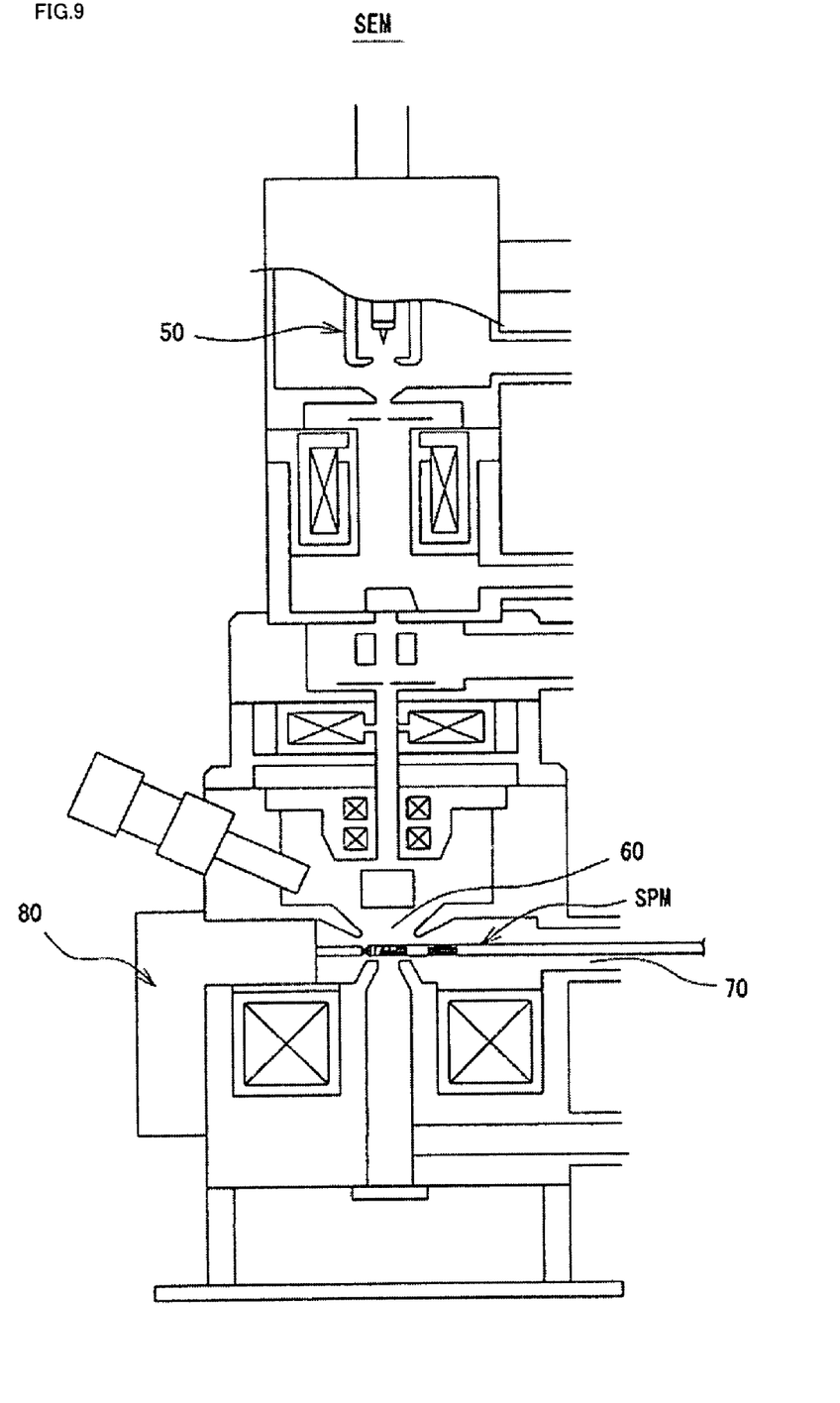
FIG. 9 is a drawing illustrating the SEM using the positioning mechanism in the first mode of embodiment mentioned above.

FIG. 9 is an explanatory drawing for depicting the in-lens type scanning electron microscope SEM having incorporated in the sample stage thereof the SPM of the mode of embodiment described above. The SEM has a lens body enclosing a vacuum and is provided in the interior thereof with an electron gun 50 for emitting an electron beam and a sample stage 60 laid in the direction of the electron beam. The SPM mentioned above is inserted via an insertion hole 70, incorporated in the sample stage 60, and fixed by having the fixing part 34 mounted in a mating hole (not shown) that is adapted to mate with the fixing part 34. The sample stage 40 is irradiated with the electron beam from the electron gun 50. For the positioning, while a conventional positioning mechanism 80 that is inherently built in the SEM can be used, the positioning mechanism 101 of this invention built in the SPM may be used. Since the SPM of this invention has a small width, it can be incorporated in the sample stage of the SEM and can easily realize combination of the SPM and the SEM. The SEM of the existing version suffices without requiring any alteration of design. Since the positioning mechanism 101 that is built in the SPM can be used, however, it is rendered possible to effect design alteration directed to omitting the conventional complicated positioning mechanism 80 installed inherently in the SEM and, as a result, promote reduction of the cost of the SEM. Further, by combining the in-lens type SEM and the SPM, it is made possible to observe the same region of a sample with two kinds of microscopes. It is also made possible to manipulate and assemble atoms and molecules with the SPM while the sample is observed with the SEM. While the SEM of the present mode of embodiment has been explained by citing the microscope that is a combination resulting from incorporating the SPM in the sample stage, what is obtained by causing the sample holder of the SEM already existing as a simple entity to be provided with the positioning mechanism 101 of this invention may be used without necessitating any combination.

INDUSTRIAL APPLICABILITY

The positioning mechanisms of the foregoing modes of embodiment have been explained by reference to the case of applying them to microscopes. They are, however, usable for various devices such as storage devices, magnetic reproducers, measurement devices, and fine processing units that are expected to utilize SPM. Then, while the foregoing modes of embodiment of SPM and SEM have been explained by reference to the case of using the positioning mechanism 101 of the first mode of embodiment, they are allowed to use the positioning mechanism of the second mode of embodiment or the positioning mechanism of this invention in other mode of embodiment.

The microscopes of the foregoing modes of embodiment have been explained by reference to the case of applying the positioning mechanism of this invention to the microscopes in the combined form. They may be applied instead to the SPM, the TEM, and the SEM as simple entities.

The invention claimed is:

1. A positioning mechanism for positioning a specimen, comprising:
    a supporting shaft including a spherical surface part and a tip portion to attach the specimen;
    a guide disposed substantially parallel to said supporting shaft; and
    impact force application means provided in the supporting shaft for exerting impact force in said supporting shaft so as to move and slide the supporting shaft, thereby positioning the specimen,
    wherein in case an axial direction of said supporting shaft constitutes a Z direction, and X, Y directions are perpendicular to the Z direction, said supporting shaft is supported by said guide at the spherical surface part so as to move by using the spherical surface part as a fulcrum in the X and Y directions and slide in the Z direction,
    said guide comprises at least three rail shape guides for nipping the spherical surface part of said supporting shaft, or one tubular member for nipping the spherical surface part of said supporting shaft by an inner periphery of the one tubular member, and
    said supporting shaft maintains its balance with the spherical surface part as the fulcrum.

2. A positioning mechanism according to claim 1, wherein said impact force application means is disposed on a side opposite to the specimen relative to said spherical surface part.

3. A positioning mechanism according to claim 1, further comprising deforming means for deforming at least part of said supporting shaft to move the specimen, said deforming means being disposed on a side same as the specimen relative to said spherical surface part.

4. A positioning mechanism according to claim 3, wherein both of
    said impact force application means and said deforming means are formed of piezoelectric elements or magnetostrictors.

5. A positioning mechanism according to claim 3, wherein the impact force application means is positioned at a side opposite to the deforming means relative to the spherical surface part for positioning the specimen by the impact force application means and the deforming means.

6. A positioning mechanism according to claim 5, wherein each of the impact force application means and the deforming means is formed of cylindrical piezoelectric elements, and is integrally formed with the supporting shaft.

7. A positioning mechanism according to claim 1, wherein said supporting shaft and the rail shape guides are housed in a holder having slits, each of the rail shape guides being fixed by being embedded in each of the slits, and the holder has a leaf spring property due to said slits.

8. A positioning mechanism according to claim 1, wherein said tubular member comprises slits so as to have a leaf spring property.

9. A microscope comprising the positioning mechanism according to claim 1.

10. A positioning mechanism according to claim 1, wherein the impact force application means is a cylindrical piezoelectric element integrally formed with the shaft, which comprises a flexible tube body, four rectangular electrodes disposed equally spaced in a circumferential direction of an outer surface of the tube body, a band-shaped electrode disposed along a circumference of the tube body, and an inner surface electrode disposed along an inner surface of the tube.

11. A positioning mechanism for positioning a specimen, comprising:
    a supporting shaft including a spherical surface part and a leading end portion for attaching the specimen;
    a plumbing part connected to a rear end portion of the supporting shaft;
    a guide disposed substantially parallel to said supporting shaft;
    impact force application means provided in the supporting shaft for exerting impact force in said supporting shaft so as to move and slide the supporting shaft, thereby positioning the specimen,
    wherein in case an axial direction of said supporting shaft constitutes a Z direction, and X, Y directions are perpendicular to the Z direction, said supporting shaft is supported by said guide at the spherical surface part so as to move by using the spherical surface part as a fulcrum in the X and Y directions and slide in the Z direction,
    said guide comprises at least three rail shape guides for nipping the spherical surface part of said supporting shaft, or one tubular member for nipping the spherical surface part of said supporting shaft by an inner periphery of the tubular member, and said supporting shaft maintains its balance on the spherical surface part as the fulcrum due to the weight of said plumbing part.

12. A positioning mechanism according to claim 11 wherein said impact force application means is disposed on a side opposite to the specimen relative to said spherical surface part.

13. A positioning mechanism according to claim 11, further comprising deforming means for deforming at least part of said supporting shaft to move the specimen, said deforming means being disposed on a side same as the specimen relative to said spherical surface part.

14. A positioning mechanism according to claim 13, wherein both of said impact force application means and said deforming means are formed of piezoelectric elements or magnetostrictors.

15. A positioning mechanism according to claim 11, wherein said supporting shaft and the rail shape guides are housed in a holder having slits, each of the rail shape guides being fixed by being embedded in each of the slits, and the holder has a leaf spring property due to said slits.

16. A positioning mechanism according to claim 11, wherein said tubular member comprises slits so as to have a leaf spring property.

17. A microscope comprising the positioning mechanism according to claim 11.

18. A positioning mechanism according to claim 11, wherein the impact force application means is a cylindrical piezoelectric element integrally formed with the shaft, which comprises a flexible tube body, four rectangular electrodes disposed equally spaced in a circumferential direction of an outer surface of the tube body; a band-shaped electrode disposed along a circumference of the tube body, and an inner surface electrode disposed along an inner surface of the tube.

* * * * *